United States Patent
Murakami

[11] Patent Number: 5,968,589
[45] Date of Patent: Oct. 19, 1999

[54] METHOD FOR MANUFACTURING WIRING PATTERN BOARD

[75] Inventor: Tomoo Murakami, Tokyo, Japan

[73] Assignee: NEC Corporation, Tokyo, Japan

[21] Appl. No.: 08/790,366

[22] Filed: Jan. 28, 1997

[30] Foreign Application Priority Data

Jan. 29, 1999 [JP] Japan .................................. 8-012882

[51] Int. Cl.⁶ .................................................. B05D 5/12
[52] U.S. Cl. .......................... 427/96; 427/123; 427/125; 430/312; 430/313; 430/315
[58] Field of Search ............................ 427/96, 123, 125; 430/312, 313, 315

[56] References Cited

U.S. PATENT DOCUMENTS

| | | | |
|---|---|---|---|
| 4,486,466 | 12/1984 | Leech et al. ............................... | 427/96 |
| 4,569,720 | 2/1986 | Schmitkons et al. .................... | 156/646 |
| 4,604,799 | 8/1986 | Gurol ........................................ | 29/897 |
| 4,835,008 | 5/1989 | DiStefano ................................. | 427/96 |
| 4,912,020 | 3/1990 | King et al. ............................... | 430/311 |
| 5,028,513 | 7/1991 | Murakami et al. ...................... | 430/315 |
| 5,051,339 | 9/1991 | Friedrich et al. ........................ | 430/311 |
| 5,112,726 | 5/1992 | Cohen et al. ............................. | 430/315 |
| 5,139,923 | 8/1992 | Toba et al. ............................... | 430/313 |
| 5,545,510 | 8/1996 | Kukanskis et al. ...................... | 430/312 |

FOREIGN PATENT DOCUMENTS

| | | | |
|---|---|---|---|
| 4-85840 | 3/1992 | Japan . | |
| 7-19799 | 3/1992 | Japan . | |
| 4-120735 | 4/1992 | Japan ...................................... | 21/321 |
| 5-335734 | 12/1993 | Japan . | |

*Primary Examiner*—Diana Dudash
*Assistant Examiner*—Paul D. Strain
*Attorney, Agent, or Firm*—Young & Thompson

[57] ABSTRACT

A wiring pattern is selectively formed on a base member by permanent resist. Furthermore, the thickness of a non-electrolytic copper plating layer is made thinner than that of a permanent resist layer on the base member, so that a concave shape is formed in combination with the permanent resist layer. A solder resist layer is formed on the non-electrolytic copper plating layer and the permanent resist layer except for a pad portion formed by the non-electrolytic copper plating layer, and a peripheral portion of the pad portion is surrounded by a wall formed by the permanent resist layer and the solder resist layer. Solder is supplied onto the pad portion surrounded by the wall by way of either the MICROPRESS method or the MICROBALL method.

5 Claims, 3 Drawing Sheets

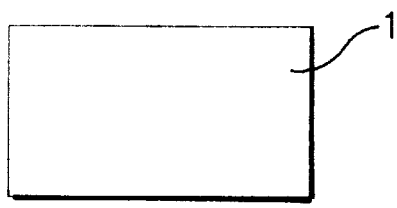
FIG. 1A
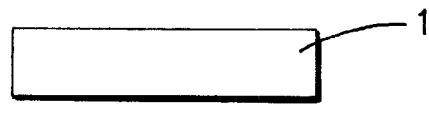
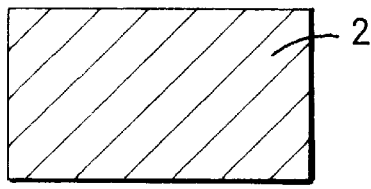
FIG. 1B
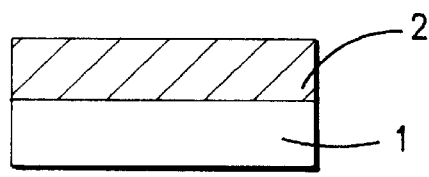
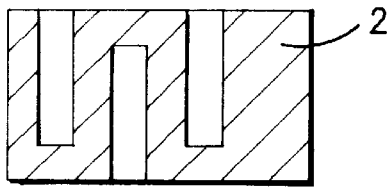
FIG. 1C
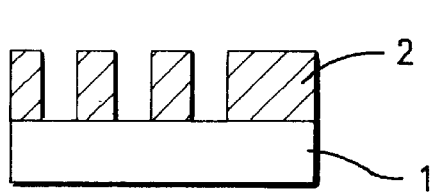
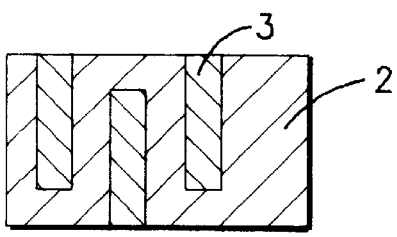
FIG. 1D
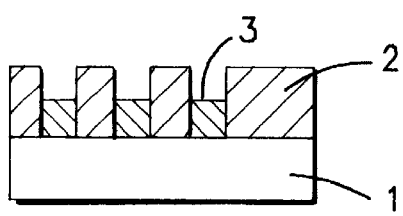
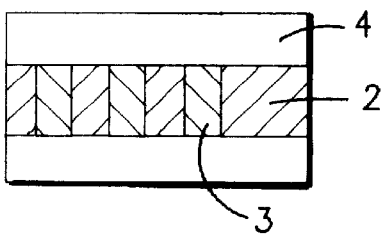
FIG. 1E
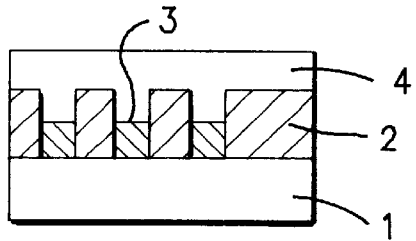
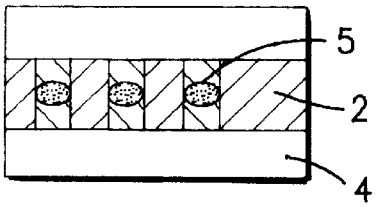
FIG. 1F
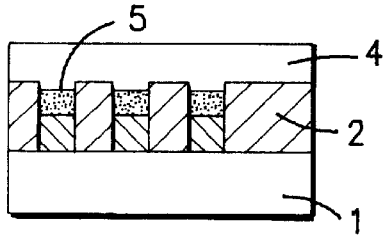
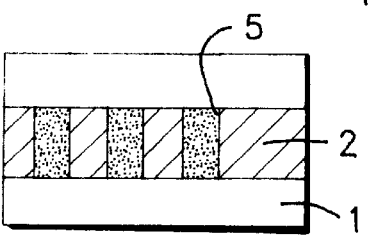
FIG. 1G
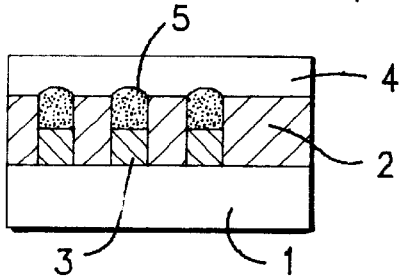

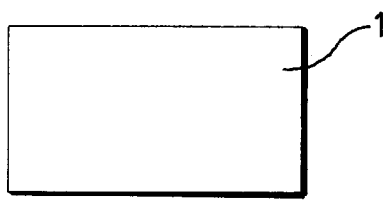
FIG. 2A
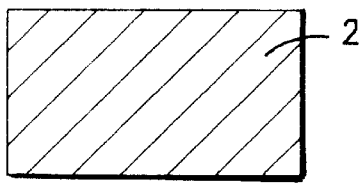
FIG. 2B
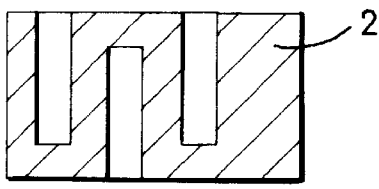
FIG. 2C
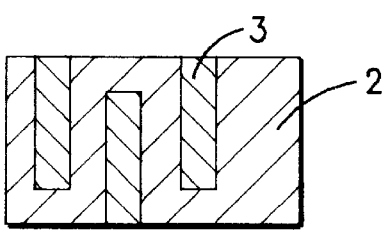
FIG. 2D
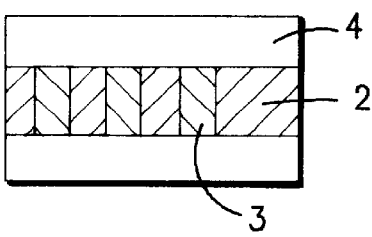
FIG. 2E
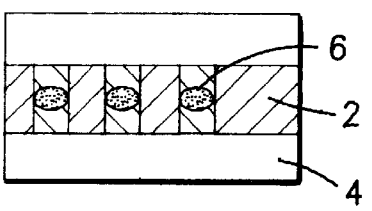
FIG. 2F
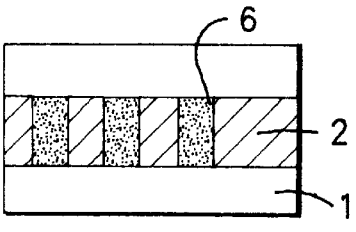
FIG. 2G
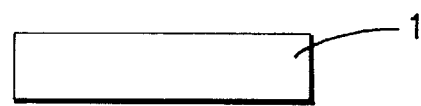
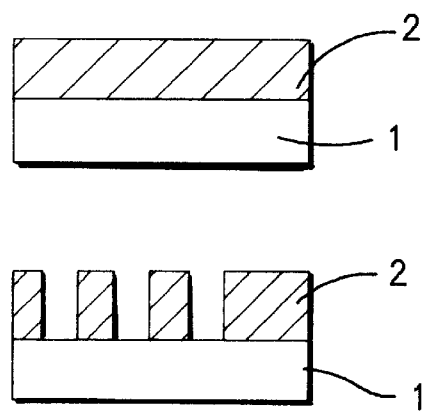
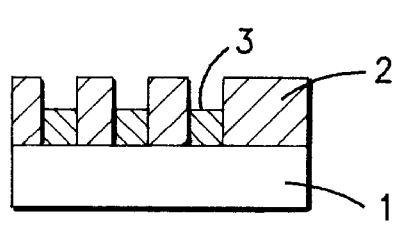
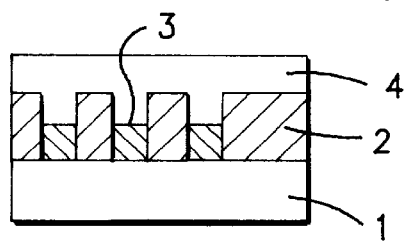
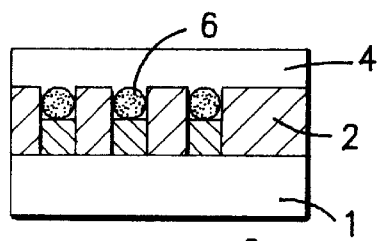
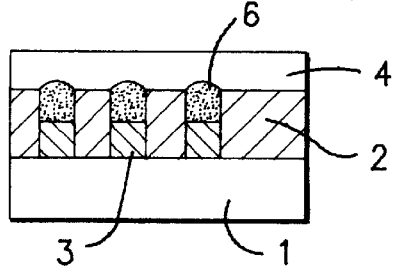

METHOD FOR MANUFACTURING WIRING PATTERN BOARD

BACKGROUND OF THE INVENTION

1. Field of the Invention

The present invention generally relates to a method for manufacturing a wiring pattern board. More specifically, the present invention is directed to a method for manufacturing a wiring pattern board, by which solder can be supplied onto a mounting pad arranged in a narrow pitch without a formation of a bridge, and also with less thickness fluctuations.

2. Description of the Related Art

Very recently, there is a trend to manufacture printed wiring pattern boards in high density and to make very narrow pitches of LSI mounting pads, while electronic appliances are made more compact and in higher performance. In general, as methods for manufacturing printed boards, either the subtractive process or the additive process is applied, as disclosed in Japanese Laid-open Patent Application No. 5-335734.

In the subtractive process, a desirable wiring pattern is formed on a stacked layer covered with copper by way of an etching process, and then a wiring pattern portion from which a mounting pad has been removed is protected by forming solder resist on this wiring pattern portion.

On the other hand, in the additive process, permanent resist is formed on a base member with catalyst in order to obtain a desirable wiring pattern, and then non-electrolytic copper plating is performed on the base member so that the desirable wiring pattern is directly formed. Thereafter, solder resist is formed on a wiring pattern portion from which a mounting pad has been removed in a similar manner to the subtractive process.

Then, as a method for supplying solder used to mount an LSI on the conventional printed wiring pattern board obtained by way of any one of the above-described subtractive and additive processes, for example, there is a solder paste printing process with employment of a metal mask. This printing process includes a limitation in supplying the solder to the mounting pad with the pad pitch of 250 to 300 $\mu$m, because there are printing shifts and limitations in forming of the metal mask opening.

Accordingly, the improved processes such as the SUPER SOLDER process and the SUPER JUFFIT process have been conventionally proposed which may overcome problems associated with the solder paste printing process. The SUPER SOLDER process is featured by using such solder paste which may react only the copper pad during the heating reaction. In this conventional process, such a metal mask may be applied that the openings in every pad are not formed, but one edge of the pad is completely printed out.

Then, the SUPER JUFFIT process is featured by using flux for fixing solder powder only on the copper pad. Similar to the SUPER SOLDER process, such metal masks may be applied that the openings every pad are not formed but one edge of the pad is completely printed out.

The previous two solder supplying processes include a feature that the solder can be supplied onto the mounting pads arranged with relatively narrow pitches without producing bridges. However, the amount of solder supplied onto each of the pads is not constant. As a result, there is a problem that the amount of solder, namely the height of solder, fluctuates between pads. Also, in these processes, the applicable amount of the solder is determined based on the surface tension defined by the pad shape. As a consequence, if the pitches are made further narrow as in the bare chip mounting pad and thus the pad width becomes narrow, then the amount of the supplied solder is accordingly lowered. Then, there is another problem that the amount of solder required for mounting purposes cannot be secured.

To solve these problems, another conventional method has been proposed in which a preselected amount of solder piece is positioned every pad, and thereafter this solder piece is melted by the reflow to supply the solder.

In the MICROPRESS process disclosed in Japanese Laid-open Patent Application No. 4-120735, the solder is punched out by the punch 7 with respect to each of the mounting pads, the punched solder is connected under pressure, and then the connected solder is melted to thereby supply the melted solder.

In the MICROBALL process disclosed in Japanese Patent Publication No. 7-19799, a very small solder ball is transferred to the mounting pad and then is melted to thereby supply the melted solder.

According to these two process, after a preselected amount of solder has been fixed to the pads arranged in the narrow pitch, this fixed solder is melted by the reflow.

There is another problem in the conventional printed wiring board manufacturing methods that the supplied solder is dropped out from the pad before being melted.

That is, the pad shape of the conventionally used printed wiring board becomes convex in the subtractive process, or flat in the additive process, whereas these shapes are made in such a way that the solder piece and the solder ball can hardly be fixed together. Therefore, there is a problem that the solder piece or the solder ball positioned on the pad cannot be sufficiently fixed on this pad, and therefore is dropped from this pad when vibrated.

Moreover, there is another problem, in the conventional printed wiring board manufacturing methods, such that when a large amount of solder is supplied to each of these plural pads arranged in the narrow pitches (for instance, not more than 120 $\mu$m pitch), the bridges are produced. In other words, when a large amount of solder is supplied to a plurality of pads arranged in the narrow pitches, the surface tension can no longer be maintained during the reflow melting operation, and thus the solder will flow along the side surface direction of the pad. As a consequence, there is a further problem that the bridges are produced.

SUMMARY OF THE INVENTION

An object of the present invention is to provide a method for manufacturing a wiring pattern board, by which solder can be supplied onto a mounting pad arranged in a narrow pitch without forming a bridge, and also with less thickness fluctuations.

To achieve the above-described object, a method for manufacturing a wiring pattern board, according to the present invention, is featured by comprising the steps of selectively forming a first resist layer on a base member, forming a plating layer on the base member, the thickness of which is made thinner than that of the first resist layer, to thereby form a concave shape in combination with the first resist layer, selectively forming a second resist layer on the plating layer and the first resist layer except for a portion of the plating layer and supplying solder onto the plating layer where the second resist layer is not formed.

BRIEF DESCRIPTION OF THE DRAWINGS

The above-described and other objects, features, and advantages of the present invention will become more apparent from the following detailed description taken with the accompanying drawings, in which:

FIGS. 1A, 1B, 1C, 1D, 1E, 1F, 1G are plan views and sectional views for explaining a method for manufacturing a printed wiring pattern board, according to a first embodiment of the present invention;

FIGS. 2A, 2B, 2C, 2D, 2F, 2G are views and sectional views for explaining a method for manufacturing a printed wiring pattern board, according to a second embodiment of the present invention;

DETAILED DESCRIPTION OF THE PREFERRED EMBODIMENT

Figure 3A:
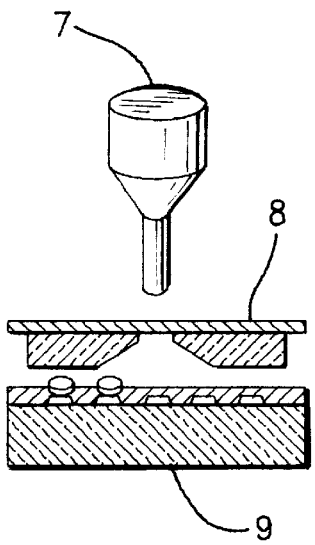
FIGS. 3A, 3B, 3C are sectional views for representing a sequential operation for supplying solder by using the MICROPRESS process in accordance with the present invention.

Referring now to drawings, a description will be made of a method for manufacturing a wiring pattern board according to a first embodiment of the present invention.

In FIG. 1A, there is shown a base member 1 which constitutes a base of a printed wiring pattern board. As to this base member 1, there is no specific limitation in materials if these materials are conventionally used as the base member of the printed board. In this first embodiment, an epoxy resin plate with glass wool base member is employed. In the wiring pattern board manufacturing method according to the first embodiment, as shown in FIG. 1B, permanent resist 2 is first coated over a substantially entire surface of the base member 1. This permanent resist 2 may form a desired pattern by way of the photolithography technique, and may constitute a plating resist in the additive process. Although no specific limitation is made in the thickness of the permanent resist 2, there is only such a condition that this thickness of the permanent resist 2 is made thicker than a thickness of a conductor circuit formed by non-electrolytic copper plating 3 shown in FIG. 1D. In this embodiment, the thickness of the permanent resist 2 is selected to be approximately 20 $\mu$m. Next, as indicated in FIG. 1C, the permanent resist 2 is exposed and then developed, so that a desired pattern is formed. It should be noted that although a pitch of a wiring pattern may be selected to be a desired pitch, such a pad pitch narrower than, or equal to 120 $\mu$m is available in this embodiment. For instance, a pitch of a mounting pad portion is selected to be 100 $\mu$m (i.e., pad width is 60 $\mu$m, pad interval is 40 $\mu$m). Subsequently, as indicated in FIG. 1D, the conductor circuit is formed by the non-electrolytic copper plating 3. It should also be noted that there is no specific limitation in the thickness of the non-electrolytic copper plating 3 if it is thinner than a thickness of the permanent resist 2. The thickness of the non-electrolytic copper plating 3 is selected to be about 15 $\mu$m in this embodiment.

As a result of executing the process steps shown in FIG. 1B to FIG. 1D, the conductor circuit formed by the non-electrolytic copper plating 3 is formed to have a concave shape with respect to the permanent resist 2. In this embodiment, a difference between the upper surface of the permanent resist 2 and the upper surface of the conductor circuit is made to become approximately 5 $\mu$m. Next, as indicated in FIG. 1E, solder resist 9 is formed on a surface of the print wiring pattern board except for the mounting pad portion. Since photosensitive solder resist is employed as this solder resist 4, the resist can be formed which may follow the permanent resist 2 and also the concaved shape of the conductor circuit. With employment of the above-described process steps, a dam is formed around the four edges of the mounting pad by the permanent resist 2 and the solder resist 4.

Figure 3B:
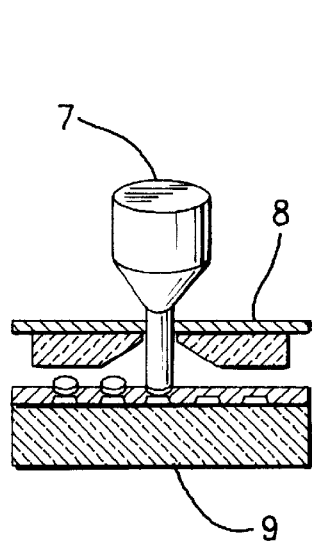
Figure 3C:
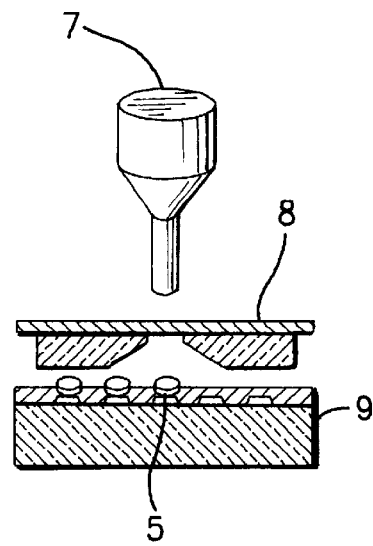

Next, as shown in FIG. 1F, a solder piece 5 is supplied onto the concave-shaped mounting pad by employing the MICROPRESS process indicated in FIG. 3A to FIG. 3C. In this case, a diameter of this solder piece 5 is defined by a width of the mounting pad, and a thickness of this solder piece 5 is defined by a total required amount of solder. In this embodiment, a solder ribbon 8 having a thickness of 50 $\mu$m is employed as a material to be punched. A solder piece having a thickness of 50 $\mu$m and a diameter of 60 $\mu$m is supplied on the mounting pad by punching this solder ribbon 8 by using a punch 7 having a diameter of 60 $\mu$m. As a soldering material, for example, a material belonging to Sn-Ag series is employed. Finally, as shown in FIG. 1G, the resultant base member 1 is supplied to a reflow apparatus (not shown in detail) in order to melt the solder pieces, so that the solder is formed on the mounting pad.

In accordance with the above-described method, a preselected amount of solder can be supplied onto the mounting pad completely surrounded by the resist.

Referring now to drawings, a method for manufacturing a wiring pattern board according to a second embodiment of the present invention will be described.

It should be understood that process steps indicated in FIG. 2A to FIG. 2E are similar to those described in the above-described first embodiment of the present invention with reference to FIG. 1A to FIG. 1E. According to this second embodiment, not the MICROPRESS method of the first embodiment, but the MICROBALL method is applied to as a method for supplying solider to a mounting pad.

That is, as shown in FIG. 2F, a very small solder ball is supplied onto a concave-shaped mounting pad by way of the MICROBALL method. In this case, a diameter of this very small solder ball 6 is determined based on a necessary amount of solder.

Figure 4A:
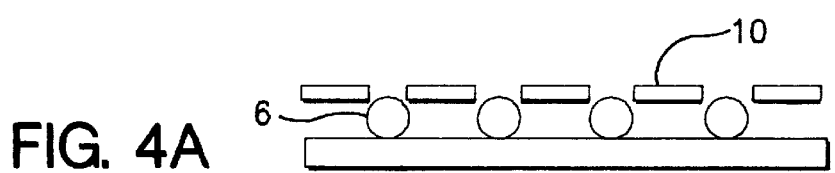
FIGS. 4A, 4B, 4C are sectional views for showing a sequential operation for supplying solder by using the MICROBALL process in accordance with the present invention.
Figure 4B:
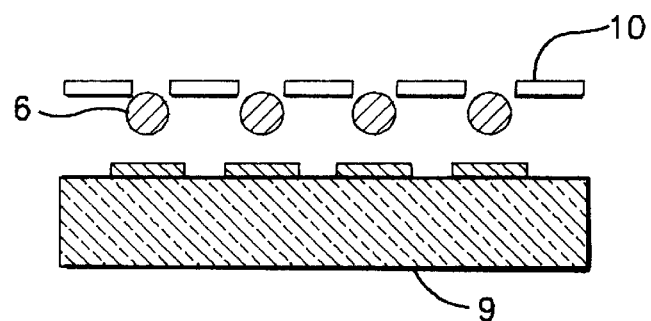
Figure 4C:
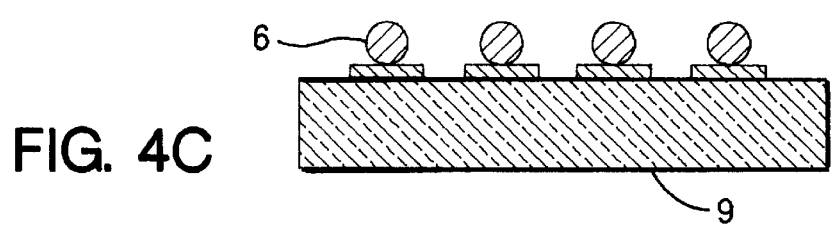

It should also be noted that the very small solder ball 6 is absorbed by using an absorbing tool 10, and then this absorbed solder ball 6 is transferred onto the mounting pad in accordance with the MICROBALL method, as indicated in FIG. 4A to FIG. 4C. In this case, flux is coated on the board 9 in order to arrange the transferred solder ball 6 on the mounting pad.

In this second embodiment, a solder ball having a diameter of 60 $\mu$m is supplied onto the mounting pad by way of such a MICROBALL method. Finally, as indicated in FIG. 2G, the resulting board is entered into the reflow apparatus so as to melt the solder ball 6, so that the solder is formed on the mounting pad.

In accordance with the above-described second embodiment, it is possible to supply a predetermined amount of solder on the mounting pad completely surrounded by the resist in a similar condition to that of the above-explained first embodiment.

Furthermore, since the MICROBALL method is applied as the method for supplying the solder, ball-shaped solder can be transferred onto a plurality of pads at the same time, so that the process time can be shortened.

According to the method for manufacturing the wiring pattern boards of the present invention, the solder can be supplied to the mounting pads with narrow pitches not more than 120 μm pitch without producing the bridges. The wall is formed around the four edges of the mounting pad by the permanent resist and the solder resist. This wall may function as a dam for preventing the solder from flowing out, and also the solder does not flow out from the surrounding walls of the pad during the reflow melting operation. Then, the amount of solder necessary for mounting purposes can be formed on the mounting pad as the solder pot.

Furthermore, according to the manufacturing method of the present invention, a preselected amount of solder can be supplied without any fluctuations. Since either the MICROPRESS process or the MICROBALL process is applied as the method for supplying the solder to the pad in accordance with the present invention, a preselected amount of the solder can be firmly supplied every mounting pad. Also, since the walls are formed by the permanent resist and the solder resist on the four surrounding edges of the mounting pad of the printed wiring board and either the solder piece or the ball-shaped solder is fixed in this dam, there is no risk that the solder is dropped out from the pad in response to vibrations and the like, comparing with the unstable fixing state in the prior art. As a consequence, a predetermined amount of solder can be firmly transferred to the reflow apparatus, and the solder can be supplied.

In addition, according to the manufacturing method of the present invention, the mounting connection on the mounting pad with the narrow pitch not more than 120 μm can be achieved with high reliability. In other words, since the sufficient amount of solder required to be mounted on the mounting pad can be supplied without any fluctuations, the mounting operation with high reliability can be performed even in the bare chip mounting in which such a narrow pitch pad smaller than, or equal to 120 μm pitch is required.

What is claimed is:

1. A method for manufacturing a wiring pattern board comprising the steps of:
    selectively forming a first resist layer on a base member;
    forming a plating layer on said base member, the thickness of said plating layer being made thinner than that of said first resist layer, to form a concave shape in combination with said first resist layer;
    selectively forming a second resist layer on said plating layer and said first resist layer except for a portion of said plating layer; and
    supplying solder onto said plating layer where said second resist layer is not formed, wherein said step for supplying the solder onto said plating layer includes the steps of:
        fixing a piece of a ribbon-shaped member formed by a solder on said plating layer; and
        continuously punching said ribbon-shaped member.

2. A method for manufacturing a wiring pattern board comprising the steps of:
    selectively forming a first resist layer on a base member;
    forming a plating layer on said base member, the thickness of said plating layer being made thinner than that of said first resist layer, to form a concave shape in combination with said first resist layer;
    selectively forming a second resist layer on said plating layer and said first resist layer except for a portion of said plating layer; and
    supplying solder onto said plating layer where said second resist layer is not formed, wherein:
        said step for supplying the solder onto said plating layer includes a step for transferring ball-shaped solder onto said plating layer.

3. A method for manufacturing a wiring pattern board comprising the steps of:
    selectively forming a first resist layer on a base member;
    forming a plating layer on said base member, the thickness of said plating layer being made thinner than that of said first resist layer, to form a concave shape in combination with said first resist layer;
    selectively forming a second resist layer on said plating layer and said first resist layer except for a portion of said plating layer; and
    supplying solder onto said plating layer where said second resist layer is not formed, wherein:
        said step for supplying the solder onto said plating layer includes a step in which after the solder is arranged on said plating layer, said solder is heated so as to be melted.

4. A method for manufacturing a wiring pattern board comprising the steps of:
    forming a wiring pattern made of a first resist layer on a base member;
    forming a plating layer on said base member, the thickness of said plating layer being made thinner than that of said first resist layer, to form a concave-shaped form in combination with said first resist layer;
    forming a second resist layer on said plating layer and said first resist layer except for a pad portion formed by said plating layer, whereby said pad portion formed by said pad portion is surrounded by a wall formed by said first resist layer and said second resist layer; and
    supplying solder onto said pad portion surrounded by side wall,
    wherein said step for supplying the solder onto said pad portion includes the steps of:
        fixing a piece of said ribbon-shaped member formed by solder on said pad portion; and
        continuously punching said ribbon-shaped member.

5. A method for manufacturing a wiring pattern board comprising the steps of:
    forming a wiring pattern made of a first resist layer on a base member;
    forming a plating layer on said base member, the thickness of said plating layer being made thinner than that of said first resist layer, to form a concave-shaped form in combination with said first resist layer;
    forming a second resist layer on said elating layer and said first resist layer except for a pad portion formed by said plating layer, whereby said pad portion formed by said pad portion is surrounded by a wall formed by said first resist layer and said second resist layer; and
    supplying solder onto said pad portion surrounded by side wall, wherein:
        said step for supplying the solder onto said pad portion includes a step for transferring ballshaped solder absorbed by a member from said solder absorbed member onto said pad portion.

* * * * *